United States Patent
Pagnanelli

(10) Patent No.: US 9,838,030 B1
(45) Date of Patent: Dec. 5, 2017

(54) APPARATUSES AND METHODS FOR SAMPLE-RATE CONVERSION

(71) Applicant: Syntropy Systems, LLC, Huntington Beach, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

(21) Appl. No.: 15/478,395

(22) Filed: Apr. 4, 2017

Related U.S. Application Data

(60) Provisional application No. 62/320,800, filed on Apr. 11, 2016.

(51) Int. Cl.
   *H03M 3/00* (2006.01)
(52) U.S. Cl.
   CPC ............... *H03M 3/38* (2013.01); *H03M 3/41* (2013.01)

(58) Field of Classification Search
   None
   See application file for complete search history.

(56) References Cited

U.S. PATENT DOCUMENTS

| | | | | |
|---|---|---|---|---|
| 5,841,388 A | * | 11/1998 | Yasuda | H03M 3/41 341/118 |
| 6,121,910 A | * | 9/2000 | Khoury | H03M 3/41 341/143 |
| 9,209,829 B2 | * | 12/2015 | Pagnanelli | H03M 3/468 |

* cited by examiner

*Primary Examiner* — Howard Williams
(74) *Attorney, Agent, or Firm* — Joseph G. Swan, P.C.

(57) ABSTRACT

Provided are, among other things, systems, apparatuses methods and techniques for automatically adjusting the noise-transfer-function of a modulator which is designed to attenuate the level of unwanted noise and/or distortion in a particular frequency band, without similarly attenuating the level of a desired signal in the same frequency band. One such apparatus includes a processing block for generating and injecting an explicit reference signal, and a processing block for detecting the amplitude of that reference signal.

11 Claims, 9 Drawing Sheets

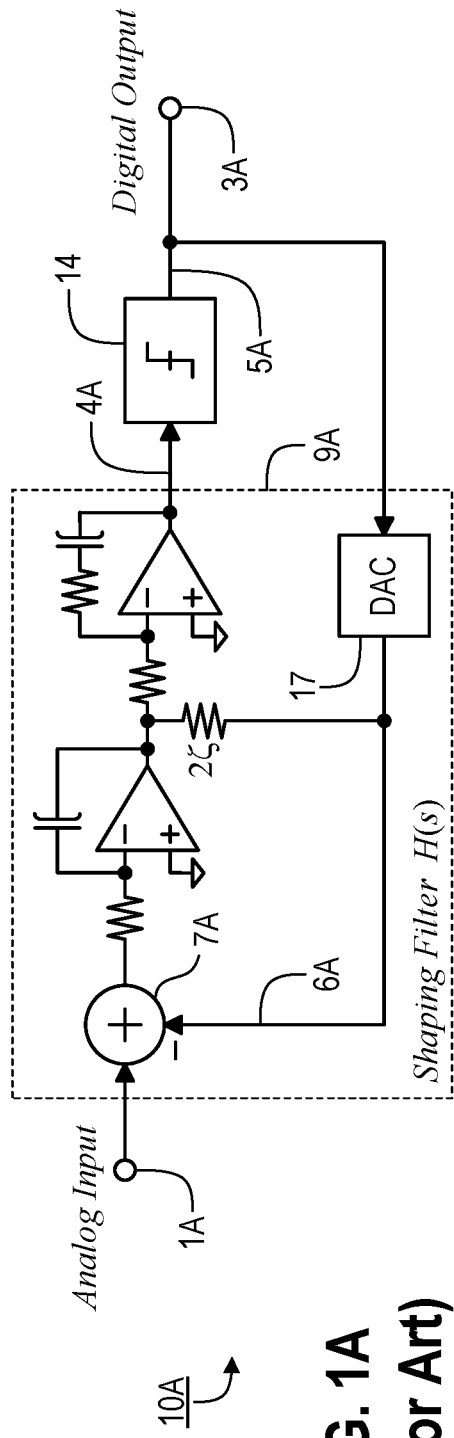
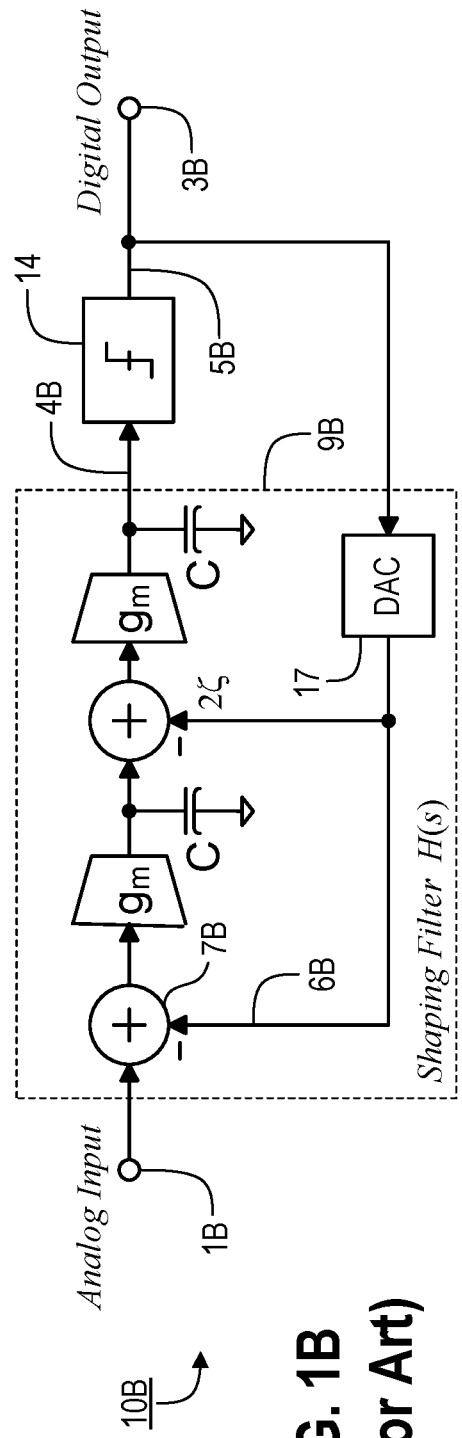
FIG. 1A (Prior Art)
FIG. 1B (Prior Art)

APPARATUSES AND METHODS FOR SAMPLE-RATE CONVERSION

This application claims the benefit of U.S. Provisional Patent Application Ser. No. 62/320,800, filed on Apr. 11, 2016, which application is incorporated by reference herein as though set forth herein in full.

FIELD OF THE INVENTION

The present invention pertains, among other things, to systems, apparatuses, methods and techniques related to automatically adjusting the noise-transfer-function of a circuit for attenuating the level of unwanted noise and distortion in a particular frequency band, without similarly attenuating the level of a desired signal in the same frequency band.

BACKGROUND

Conventionally, the process of using feedback to attenuate the level of additive noise and distortion in a particular frequency band, without attenuating the level of a signal in the same frequency band, is referred to as noise-shaping. Use of feedback to combine a corrupted output signal (i.e., an impaired output signal) with an underlying input signal, followed by subsequent processing, causes unwanted signal impairments to be filtered with one transfer function (i.e., a noise-transfer-function) while a desired input signal is filtered with a different transfer function (i.e., a signal-transfer-function). Typically, noise and distortion are shifted (i.e., shaped by the noise-transfer-function) into frequencies that lie outside the band of an underlying input signal (e.g., the band determined by the signal-transfer-function). The processing that produces this noise-shaped response is sometimes referred to as modulation, and the circuitry associated with this processing, is sometimes referred to as a modulator. Common uses of noise-shaping include data converters based on delta-sigma (ΔΣ) modulation and data converters based on diplexing-feedback-loops (DFLs), which conventionally are used to transform analog signals into representative digital samples.

Examples of conventional delta-sigma modulators 10A&B are illustrated in FIGS. 1A&B, respectively. Modulators 10A&B operate on continuous-time input signals, and therefore, are referred to as continuous-time delta-sigma (CT-ΔΣ) modulators. Such conventional CT-ΔΣ modulators produce a coarsely quantized version (e.g., digital samples on outputs 3A&B) of a continuous-time input signal (e.g., analog signals on inputs 1A&B), using a sampling rate which is many times the bandwidth of the input signal (i.e., the input signal is oversampled). As shown in FIGS. 1A&B, conventional CT-ΔΣ modulators include: 1) an input combining operation (e.g., within subtractors 7A&B); 2) an integration function of second-order (e.g., discrete integrators within shaping filters 9A&B); 3) a rounding/truncation function (e.g., within quantizing element 14); and 4) a feedback digital-to-analog (D/A) conversion function (e.g., within D/A converter 17). A variation of the CT-ΔΣ modulator is the discrete-time delta-sigma (DT-ΔΣ) modulator, which includes a sample-and-hold function at the modulator input, such that the modulator operates on the discrete-time samples of an input signal. Referring to FIGS. 1A&B, modulators 10A&B produce a signal-transfer-function $H_{STF}$ (i.e., a transfer function from inputs 1A&B to outputs 3A&B, respectively) which is of the form $$H_{STF}(s) = \frac{\omega_n^2}{s^2 + 2\zeta\omega_n \cdot s + \omega_n^2},$$

and produce a (quantization) noise-transfer-function $H_{NTF}$ (i.e., a transfer function from a virtual point of noise addition within quantizing element 14 to outputs 3A&B) which is of the form $$H_{NTF}(s) = \frac{s^2}{s^2 + 2\zeta\omega_n \cdot s + \omega_n^2}.$$

In addition to quantization noise, any other error or interference introduced onto the input (e.g., lines 4A&B) of quantizing element 14, or the output (e.g., lines 5A&B) of quantizing element 14, are subjected to this noise-transfer-function. The NTF produces a frequency response which is high-pass and similar to curve 18A shown in FIG. 1C, while the STF produces a frequency response that is lowpass and similar to curve 18B shown in FIG. 1C. Modulators (e.g., modulators 10A&B) having an NTF which is high-pass, conventionally are referred to as lowpass ΔΣ modulators and are utilized to attenuate the low-frequency quantization noise which is introduced by a coarse quantization operation (i.e., in the present examples, noise from quantizing element 14).

An alternative to the conventional ΔΣ modulator is the diplexing-feedback-loop (DFL) modulator, previously provided by the present inventor, e.g., as described in U.S. patent application Ser. No. 12/824,171 (now U.S. Pat. No. 8,089,382), Ser. No. 12/985,238 (now U.S. Pat. No. 8,299,947), Ser. No. 13/363,517 (now U.S. Pat. No. 8,943,112), Ser. No. 14/567,496 (now U.S. Pat. No. 9,209,829), Ser. No. 12/985,214 (now U.S. Pat. No. 8,416,111) and Ser. No. 14/558,640 (now U.S. Pat. No. 9,130,584), which are referred to herein as the "Related Patents" and are incorporated by reference herein as though set forth herein in full. An exemplary DFL is modulator 20, shown in FIG. 2. Like a conventional ΔΣ modulator, DFL modulator 20 produces an oversampled and coarsely quantized version of a continuous-time input signal (e.g., the input analog signal on line 1C), such that the quantization noise introduced by the coarse quantization operation (e.g., noise from quantizing element 14), is attenuated in a frequency band occupied by the input signal. Also, the DFL modulator is similar to a conventional ΔΣ modulator in that it does not appreciably attenuate the input signal itself. Rather than connecting the output of a combining operation (e.g., within adder 7C) to the input of a coarse quantization operation (e.g., quantizing element 14) through a filter transfer function (e.g., through integrators in a feed-forward path), however, the DFL modulator shapes noise by feeding back an error signal (i.e., signal 6C) which is generated through a linear combination of two feedback signals: 1) a filtered version of the input to the quantizing element (i.e., input signal 4C at node 13); and 2) a filtered version of the output from the quantizing element (i.e., output 5C). Since the DFL modulator does not rely on active integrators or filtering in a feed-forward path, the DFL modulator has significant performance advantages over a conventional ΔΣ modulator, including: 1) the DFL modulator is better suited for high-frequency operation because there are no active integrators which limit processing bandwidth; 2) the DFL modulator has an STF which is essentially all-pass because filtering takes place within a feedback path;

and 3) the NTF of the DFL modulator is easily configured to exhibit band-stop responses as well as high-pass responses (i.e., the NTF can be configured to attenuate noise in a frequency band centered at other than zero hertz). Referring to the block diagram shown in FIG. 2, the linearized noise-transfer-function (NTF) produced by DFL modulator 20, is of the form $$NTF(s) = \frac{1 + H_1(s) \cdot H_3(s)}{1 + H_1(s) \cdot H_3(s) - H_2(s) \cdot H_3(s)},$$

where it can be shown that for the appropriate choice of filter responses (e.g., $H_1$, $H_2$, and $H_3$), DFL modulator 20 can produce a second-order, noise-shaped response that is comparable to that of a conventional $\Delta\Sigma$ modulator (e.g., modulators 10A&B). More specifically, an appropriate choice for the filter responses is:

$$H_1(s) \cdot H_3(s) = \phi_{00} \cdot W_{00}(s) + \phi_{01} \cdot W_{01}(s)$$

$$H_2(s) \cdot H_3(s) = \phi_{10} \cdot W_{10}(s) + \phi_{11} \cdot W_{11}(s),$$

where $\phi_{ij}$ are positive or negative scalars (i.e., gain terms) and $W_{ij}(s)$ are lowpass responses of first to fifth order. For the case where $\phi_{00} = \phi_{10} = -2$ and $\phi_{01} = \phi_{11} = +1$, the NTF produced by DFL modulator 20 is a high-pass response similar to curve 18A in FIG. 1C, and consequently, attenuates low-frequency noise. For other values of $\phi_{ij}$, the NTF produced by modulator 20 can be configured to produce a band-stop response with a spectral null at an arbitrary frequency $f_n$, where $\phi_{00} = -2 \cdot \cos(2 \cdot 7 \cdot f_n/f_S)$ and $f_S$ is the sampling rate of quantizing element 14. In addition to quantization noise, any error and/or interference introduced onto the input (e.g., line 4C) or the output (e.g., line 5C) of quantizing element 14 is subjected to this noise-transfer function.

Regardless of modulator type, maximum noise attenuation occurs when the stopband region associated with the noise-transfer-function of the modulator (e.g., DFL modulator 20) is closely aligned with the center frequency of a digital filter at the output of the modulator (e.g., output 3C of DFL modulator 20). The response of the digital filter is designed to pass the signal component from the output of the modulator to the output of the associated data converter, and reject the unwanted quantization noise that has been shaped to occupy a different frequency band from the signal. As illustrated by data converter 30A of FIG. 3A, a DFL modulator (e.g., modulator 19A comprising shaping filter 37, combiner 33, and quantizing element 34) is typically paired with a bandpass moving-average filter (e.g., filter 35), which like the modulator (e.g., modulator 19A), has a response that depends on programmable parameters. The passband region of bandpass filter 35 is established by digital values. The stopband region produced by the NTF of DFL modulator 19A, however, is a function of analog gain terms (i.e., scalar parameters $\phi_{ij}$), and consequently, the response of the DFL modulator is subject to component tolerances. To provide for maximum noise attenuation, therefore, as described in the Related Patents, the DFL converter (e.g., data converter 30A) can include a means of calibration that aligns the stopband produced by the NTF of the DFL modulator (e.g., modulator 19A) with the passband of the bandpass filter (e.g., filter 35).

DFL-based data converter 30A of FIG. 3A, employs a calibration (i.e., tuning) mechanism which includes a means for tuning the gain parameters (i.e., coefficients) of the DFL modulator (e.g., coefficients within shaping filter 37) according to the overall level at the output of the bandpass filter (e.g., bandpass moving-average filter 35). Since the shaped quantization noise at the output of quantizing element 34 is additive with respect to the input signal, the overall signal-plus-noise level at the output of bandpass filter 35 is proportional to the level of added quantization noise. The level of added quantization noise is minimum when the NTF response of modulator 19A is properly aligned with the response of bandpass filter 35, and therefore, the output of bandpass filter 35 provides a measure of NTF calibration (i.e., provides a tuning metric). More specifically, the added quantization noise is a minimum when the coefficients $\phi_{ij}$ of shaping filter 37 are properly tuned, such that the NTF response exhibits a deep quantization noise null at the correct frequency (i.e., the center frequency of the bandpass filter response). Calibration within data converter 30A typically is such that the overall power (or signal strength) at the output of bandpass filter 35 is sensed using a square law operation (e.g., within detector 36), and then the coefficients of DFL shaping filter 37 are alternately adjusted, using an algorithm within processing block 38, until the overall power level (or signal-strength) at the output of bandpass filter 35 is forced to a minimum.

A second example of existing DFL calibration is that utilized by data converter 30B, shown in FIG. 3B. The calibration (i.e., tuning) within DFL-based data converter 30B adjusts the gain parameters of DFL shaping filter 37 according to a residual level of added quantization noise. Residual quantization noise is measured as the difference between the input of quantizing element 34 and the output of quantizing element 34, and is a minimum for a properly tuned DFL modulator. Referring to data converter 30B, a regressor signal $\rho$ (i.e., on line 43) is generated from filter response $W_{00}(s)$ (i.e., within circuit 40A as shown, and/or within shaping filter 37), filter response $W_{10}(s)$ (i.e., within circuit 40B as shown, and/or within shaping filter 37), and adder 42 according to:

$$\rho(t) = Q_x(t) * W_{01} - x(t) * W_{00},$$

where: 1) the * operator represents linear convolution; 2) x(t) is the input to quantizing element 34; 3) $Q_x(t)$ is the quantized output of quantizing element 34; and 4) $W_{ij}$ are filter responses associated with shaping filter 37 of DFL modulator 19A. In the present exemplary converter, the calibration error on line 41 (i.e., the tuning metric) is generated from the regressor signal $\rho(t)$ though a sequence of processing steps that include: 1) quantization via single-bit sampling/quantization circuit 44; 2) downconversion to baseband via mixer 47 and sinusoidal sequence 48; and 3) lowpass filtering via filter 49. Sinusoidal sequence 48 has a frequency ($\omega_k$) which corresponds to the intended center of a stopband response produced by the noise-transfer-function of modulator 19A. Using similar processing to DFL-based data converter 30A, the overall power (or signal strength) at the output of lowpass filter 49 is sensed using square law operation 36, and then using an algorithm within processing block 38, the coefficients of shaping filter 37 are alternately adjusted until the overall power level (or other measure of signal strength) at the output of lowpass filter 49 is forced to a minimum.

Each of the modulator calibration methods described above can be considered a passive approach, in that a calibration error is generated during a normal mode of operation, and does not involve the use of explicit reference signals (calibration waveforms) with deterministic (known) properties. These passive approaches can be advantageous from the standpoint of reducing potential disturbances to the normal operation of the data converter. However, the present inventor has determined that, compared to active calibration approaches, which employ explicit reference signals to provide a direct indication of tuning offsets, these passive approaches can result in less-optimal tuning (i.e., imperfect alignment of modulator and digital filter responses). For example, calibration errors based on a bandpass filter output can be confused by variations in signal power, because the output of the bandpass filter is a function of both signal power and quantization noise power. Calibration errors based on a measure of residual quantization noise (i.e., differences between the input and output of a quantizing element) are inherently noisy measurements, and therefore, can be unreliable indicators of optimal tuning. Consequently, the present inventor has determined that it is desirable to have improved methods for calibrating the responses of modulators which attenuate the level of unwanted noise and distortion in a particular frequency band, without similarly attenuating the level of a desired signal in the same frequency band.

SUMMARY OF THE INVENTION

The present invention provides, among other things, improved methods and structures for calibrating the noise-transfer function of a modulator used for noise-shaping applications. Unlike previous methods which utilize a passive means for generating a calibration error, the present invention utilizes an active means, whereby an explicit reference signal with deterministic characteristics is introduced into the modulator in a manner that preferably: 1) creates minimal disturbance to the normal operation of the modulator and associated data converter; and 2) provides a means for directly measuring a misalignment in the noise-transfer-function (NTF) of the modulator. Compared to conventional circuits used for modulator calibration, an apparatus and methodology according to the preferred embodiments of the present invention typically can provide more effective calibration of the noise-shaped response produced by the modulator, so that subsequent filtering can remove a greater amount of shaped quantization noise.

Thus, one specific embodiment of the invention is directed to an apparatus for calibrating the noise-transfer-function of a noise-shaping modulator, and includes: 1) an input line for receiving an input signal (e.g., which has been output from the noise-shaping modulator); 2) a first combiner (e.g., adder or subtractor) with a first input coupled to the input line, a second input coupled to a reference signal and an output; 3) a first output line coupled to the output of the first combiner, which provides (e.g., to the noise-shaping modulator) a composite signal comprising the input signal and an explicit reference signal; 4) a second output line for providing one or more signals to control configurable parameters within the noise-shaping modulator; 5) a quadrature frequency downconverter with an input coupled to the first output line, a quadrature output at baseband, and an in-phase output at baseband; 6) a first summation circuit with an input coupled to the quadrature output of the quadrature frequency downconverter, and also having an output; 7) a second summation circuit with an input coupled to the in-phase output of the quadrature frequency downconverter, and also having an output; 8) a second combiner with a first input coupled to the output of the first summation circuit, a second input coupled to the output of the second summation circuit, and an output; 9) a reference signal (e.g., calibration waveform) generator with an output coupled to the second input of the first combiner; and 10) an adaptive control unit with an input coupled to the output of the second combiner and one or more outputs coupled to the second output line. The output of the first combiner is coupled to the first output line via a coarse quantization operation (e.g., via an external sampling/quantization circuit). The quadrature frequency downconverter uses sine and cosine sequences to produce quadrature and in-phase outputs at baseband, respectively, and the frequency of each sequence corresponds to the center of the intended stopband response for the noise-transfer-function produced by the modulator. The reference generator produces an output that includes a narrowb and frequency component which corresponds to the frequency of the sinusoidal sequence used for downconversion. The output of the summation circuit is proportional to the mean signal level at the output of the frequency downconverter. The adaptive control unit generates one or more output signals that determine the value of one or more settable (programmable) parameters within the noise-shaping modulator.

A more-generalized embodiment of the invention is directed to an apparatus for calibrating the noise-transfer-function of a noise-shaping modulator, and includes: 1) an input line for receiving an input signal (e.g., which has been output from the noise-shaping modulator); 2) a combiner (e.g., adder or subtractor) with a first input coupled to the input line, a second input coupled to a reference signal and an output; 3) a first output line coupled to the output of the combiner, which provides (e.g., to the noise-shaping modulator) a composite signal comprising the input signal and an explicit reference signal; 4) a second output line for providing one or more signals to control configurable parameters within the noise-shaping modulator; 5) a frequency downconverter with an input coupled to the first output line, and also having a baseband output; 6) a summation circuit with an input coupled to a baseband output of the frequency downconverter, and also having an output; 7) a reference (e.g., calibration waveform) generator with an output coupled to the second input of the combiner; and 8) an adaptive control unit with an input coupled to the output of the summation circuit and one or more outputs coupled to the second output line. The output of the first combiner is coupled to the first output line via a coarse quantization operation (e.g., via an external sampling/quantization circuit). The frequency downconverter uses a sine or cosine sequence to produce a baseband output, and the frequency of the sine or cosine sequence corresponds to the center of the intended stopband response for the noise-transfer-function produced by the modulator. The reference (waveform) generator produces an output that includes a narrowband frequency component which corresponds to the frequency of the sinusoidal sequence used for downconversion. The output of the summation circuit is proportional to the mean signal level at the output of the frequency downconverter. The adaptive control unit generates one or more output signals that determine the value of one or more settable (programmable) parameters within the noise-shaping modulator.

An even further generalized embodiment of the present invention is directed to an apparatus for calibrating a noise-shaping modulator which includes: 1) an input line for receiving an input signal (e.g., which has been output from the noise-shaping modulator); 2) a combiner having a first input coupled to the input line, a second input coupled to a reference signal, and an output; 3) an output line for providing one or more signals to control configurable parameters within the noise-shaping modulator; 4) a frequency downconverter having an input coupled to the output of the combiner, and also having a baseband output; 5) a summation circuit having an input coupled to the baseband output of the frequency downconverter and also having an output; and 6) an adaptive control unit having an input coupled to the output of the summation circuit and one or more outputs coupled to the output line, in which the output of the summation circuit is proportional to a representative signal level at the baseband output of the frequency downconverter, and the output of the adaptive control unit is continually altered in an attempt to minimize a signal provided at the input of the adaptive control unit.

A calibration circuit, which incorporates any of the embodiments of the invention described above, often can effectively tune the noise-transfer-function of a noise-shaping modulator with greater precision than is possible by conventional means and apparatuses. Such a calibration circuit thereby enables a data converter which utilizes noise-shaping, to attenuate a greater amount of shaped quantization noise, and attain the levels of performance required for advanced commercial, industrial and military applications, e.g., various direct conversion transmitters, software-defined or cognitive radios, multi-channel communication transmitters, all-digital RADAR systems, and high-speed arbitrary waveform generators.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 1A is a block diagram of a conventional delta-sigma modulator that shapes quantization noise according to a second-order response, utilizing operational amplifiers to perform a feed-forward integration operation; FIG. 1B is a block diagram of a conventional delta-sigma modulator that shapes quantization noise according to a second-order response, utilizing transconductance amplifiers to perform a feed-forward integration operation.

DESCRIPTION OF THE PREFERRED EMBODIMENT(S)

Conventional noise-shaping modulators are used to improve the effective resolution of data converters which transform analog signals into representative digital samples. Continuous-time modulators have the potential to operate at much higher frequencies than discrete-time modulators, but the noise-shaping performance of continuous-time modulators is subject to analog component tolerances which degrade the response of a noise-transfer-function. Calibration techniques can be utilized to correct for the degradations caused by analog component tolerances, but conventional methods which rely on passive (detection-only) approaches are prone to calibration errors. The present inventor has discovered that without degrading the performance of the modulator and/or associated converter, active calibration approaches can be employed, whereby an explicit reference (known) signal is coupled (injected) directly into the modulator, and then the modulator's effect on that reference signal is observed (detected), to determine what adjustments are needed to improve the noise-transfer-function. Active calibration based on an explicit reference signal, with known (deterministic) properties, results in more accurate calibration than what is possible with passive approaches that rely, for example, on the general properties of uncontrolled signals.

Figure 3A:
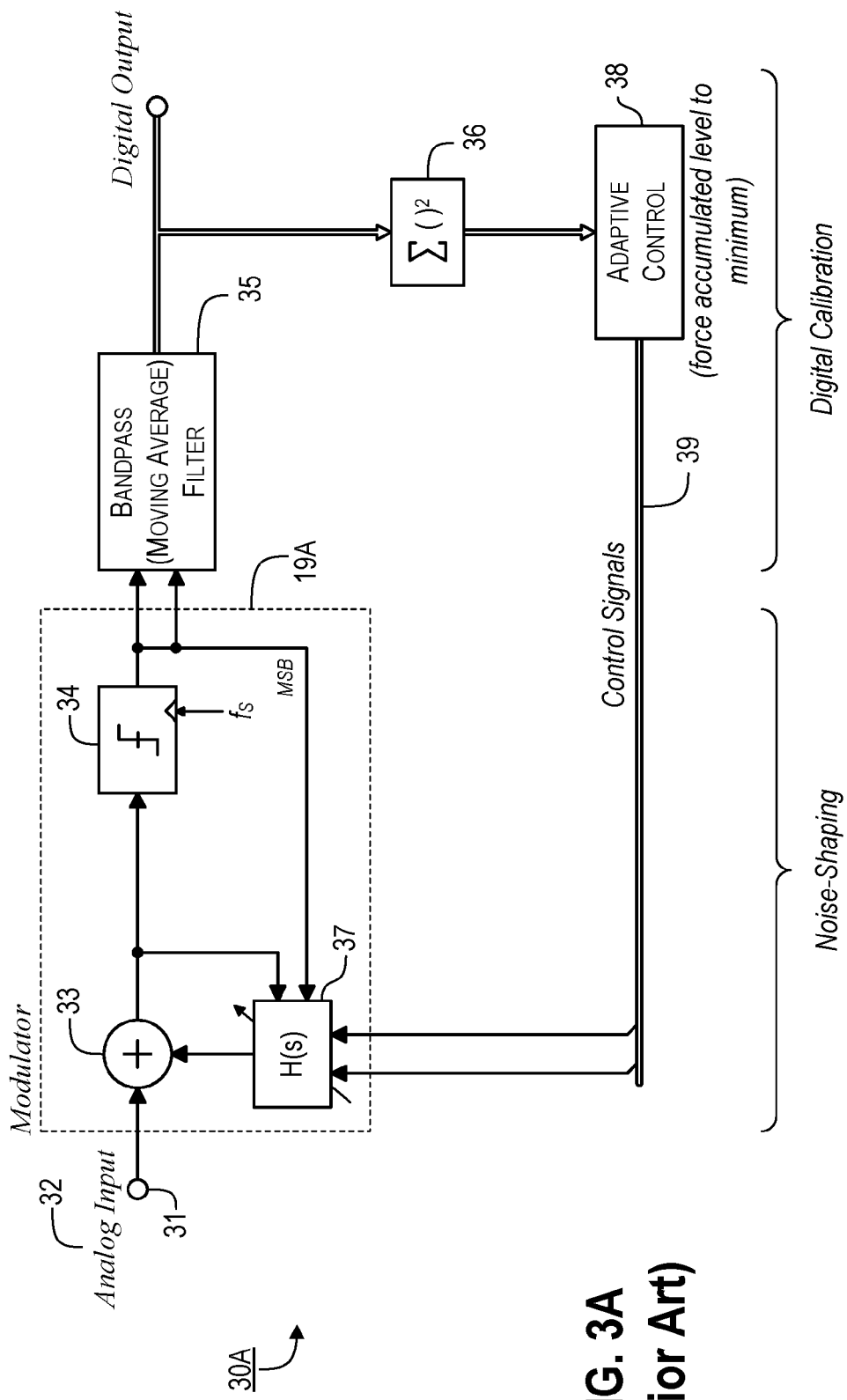
FIG. 3A illustrates a data converter which incorporates a diplexing-feedback-loop (DFL) modulator and passively calibrates the response of a noise-transfer-function, via a mechanism that minimizes the level sensed at the output of a digital bandpass filter.
Figure 3B:
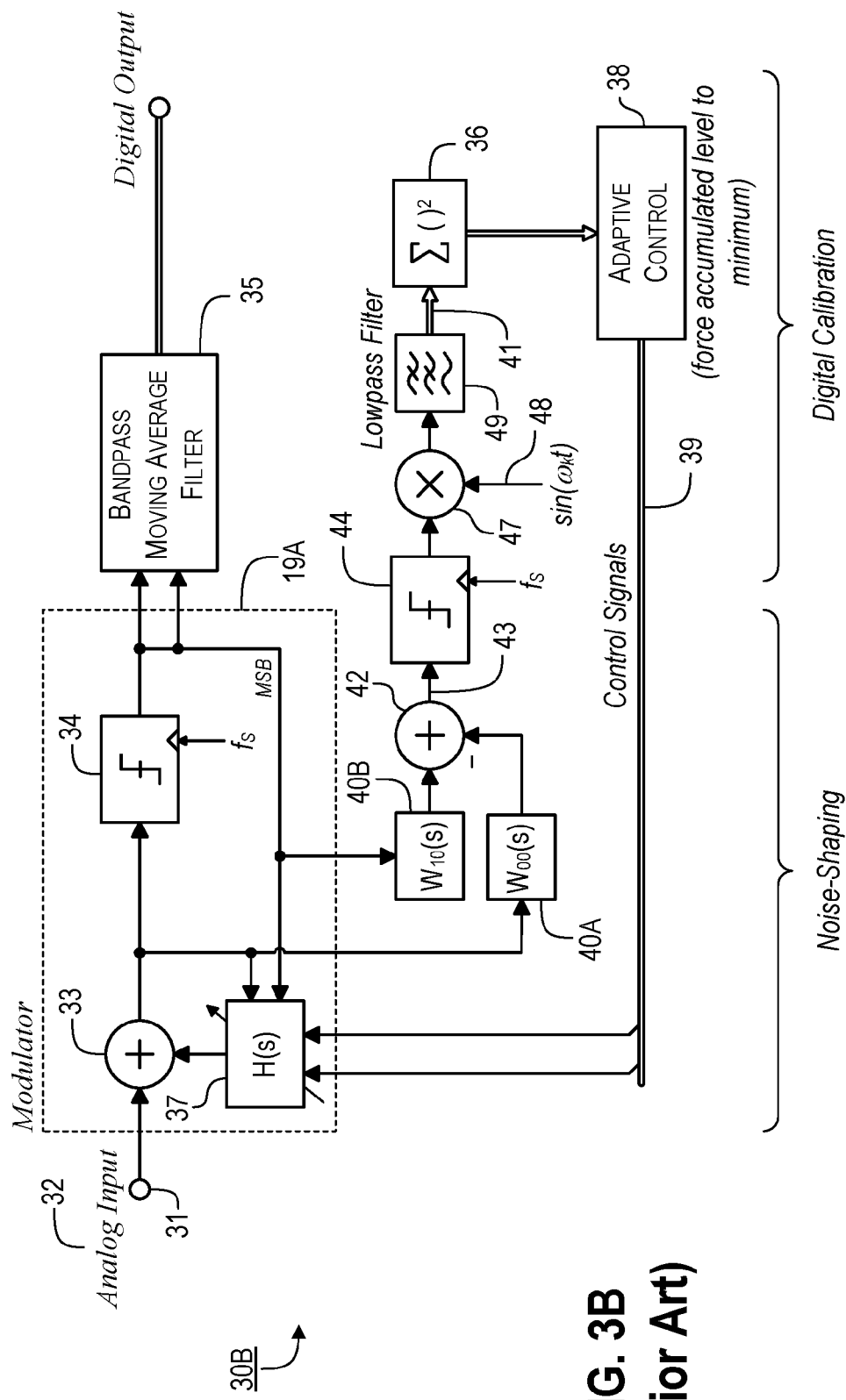
FIG. 3B illustrates a data converter which incorporates a diplexing-feedback-loop (DFL) modulator and passively calibrates the response of a noise-transfer-function via a mechanism that minimizes, in a frequency band determined by a frequency downconverter, the difference between the signals at the input and output of a coarse quantizing element.
Figure 4A:
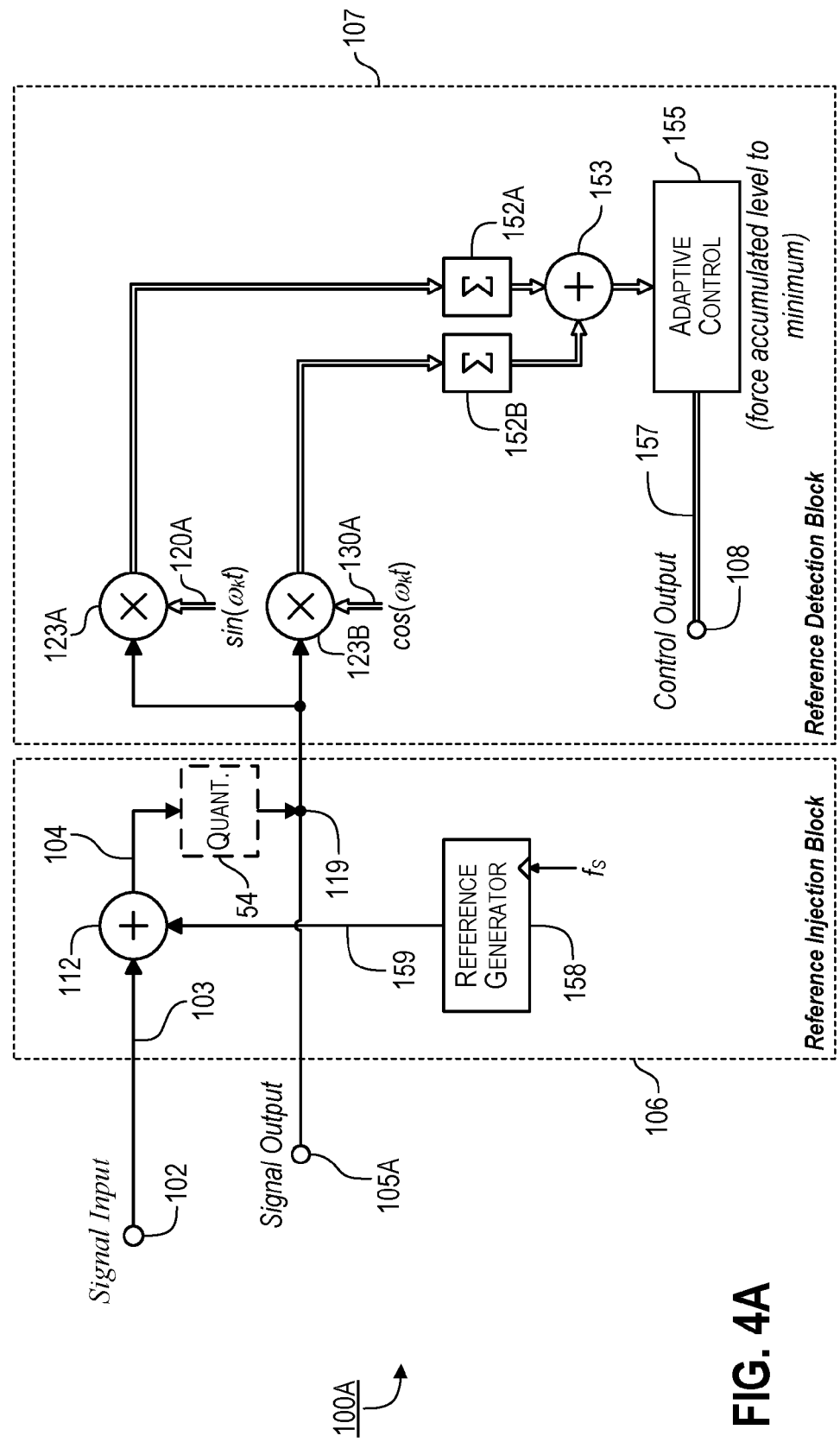
FIG. 4A is a simplified block diagram of a calibration circuit according to a representative embodiment of the invention, which performs quadrature amplitude detection upon an injected reference signal (calibration waveform), to produce an output signal that can be used to actively calibrate the noise-transfer-function of a noise-shaping modulator.
Figure 4B:
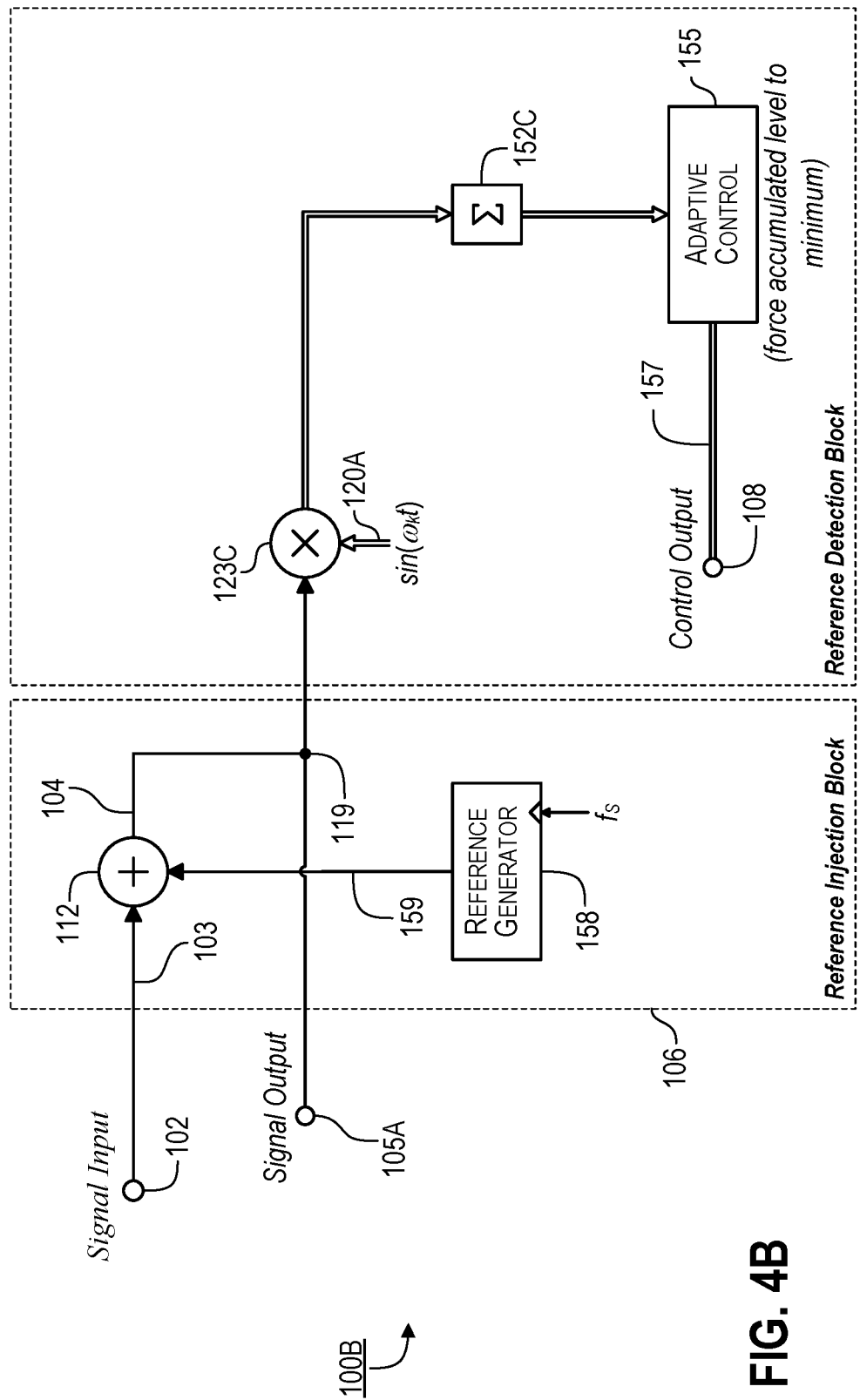
FIG. 4B is a simplified block diagram of a calibration circuit according to a representative embodiment of the invention, which performs baseband amplitude detection upon an injected reference signal (calibration waveform), to produce an output signal that can be used to actively calibrate the noise-transfer-function of a noise-shaping modulator.

A simplified block diagram of an active calibration circuit 100A according to the preferred embodiments of the invention is illustrated in FIG. 4A. In the preferred embodiments, an active calibration circuit comprises two major processing blocks: 1) an injection block (e.g., block 106 comprising reference generator 158 and combiner 112) for generating and combining a known reference signal (calibration waveform) with an input signal, which preferably is an output from a noise-shaping modulator (e.g., the reference signal on line 159 is combined with a modulator output signal on line 103, to produce a composite signal on line 104); and 2) a detection block (e.g., block 107 comprising quadrature downconverter 123A&B, summation circuits 152A&B, adder 153, and adaptive control unit 155) for detecting the amplitude of that reference (calibration) signal at the output of injection block 106, in order to generate output value(s) which preferably are used for controlling parameters within a noise-shaping modulator (e.g., the amplitude of the reference signal on output line 105A, and also coupled to node 119, is used to generate control values 157 on output line 108). In this embodiment, the combination of summation circuits 152A&B and adder 153 can itself be considered a summation circuit (e.g., having an output that is proportional to the representative signal level at the baseband output of the quadrature frequency downconverter 123A&B). Preferably, the output of combiner 112 (e.g., the output of the combiner on line 104) is coupled to the input of the quantizing element 54 of a noise-shaping modulator (e.g., quantizing element 34 of data converter 30A in FIG. 3A), and the signal at node 119 and on output line 105A is coupled to the output of the same quantizing element 54. Hence, output 104 of the combiner is coupled to node 119 and to output line 105A via a quantization operation in the preferred embodiments. However, in alternate embodiments, the output of combiner 112 instead is coupled to an interior point within quantizing element 54, and such alternative embodiments should be considered within the scope of the invention. In various different embodiments, however, the reference signal is injected into the quantizing element before node 119, the node from which the output of quantizing element 54 is coupled to the input of detection block 107, and is also fed back to the modulator via output line 105A. In the preferred embodiments, the signal on output line 105A includes both a quantized version of the input signal on line 103 (e.g., from input line 102), and a quantized version of the reference signal (e.g., the reference signal on line 159). The reference signal (calibration waveform) preferably includes a sinusoidal component with a frequency ($\omega_k$) that corresponds to the center of the intended stopband response of the noise-transfer-function produced by the modulator (e.g., DFL modulator 19A of converter 30A in FIG. 3A). Furthermore, the amplitude of the reference signal preferably is detected (e.g., in detection block 107) using a quadrature detection process, in which the reference signal at node 119 (and on output line 105A) is first downconverted from a center frequency of $\omega_k$ to a center frequency of zero-hertz (e.g., utilizing sine sequence 120A and cosine sequence 130A). As a result of such downconversion, the amplitude of the reference signal can be reliably determined using a summation (averaging) operation. A quadrature detection process is utilized in the preferred embodiments to ensure that the measured amplitude of the reference signal is independent of the phase of the reference signal. In alternate embodiments, however, the complexity of the detection circuitry is reduced by using a simple baseband detection process, e.g., as illustrated in exemplary circuit 100B, shown in FIG. 4B. In exemplary circuit 100B, reference detection involves a single downconversion process (e.g., downconverter 123C) and a single summation operation (e.g., summation circuit 152C).

Preferably, the complexity of reference generator 158 is reduced by utilizing circuitry that produces a binary (two-state) output, with a sinusoidal component at the intended frequency $\omega_k$ (i.e., the center of the intended stopband response of the noise-transfer-function produced by the modulator). More preferably, the output of reference generator 158 is a periodic binary pulse, such that: 1) the desired reference frequency $\omega_k$ is an integer multiple of the pulse repetition rate; and 2) the pulse repetition period is an integer multiple of the pulse width. A periodic binary pulse has harmonics at its pulse repetition rate, and therefore, a calibration waveform with the above two properties has a sinusoidal component at the desired reference frequency, and also has minimal spurious content. In alternate embodiments, however, the output of reference generator 158 is a square wave, such that the ratio of the desired reference frequency $\omega_k$ to the frequency of the square wave is an odd integer. The preferred pulse generator can be implemented using various conventional methods, including those that employ binary counters, frequency dividers, and/or shift registers. The aforementioned alternate embodiments should be considered within the scope of the present invention.

Figure 1C:
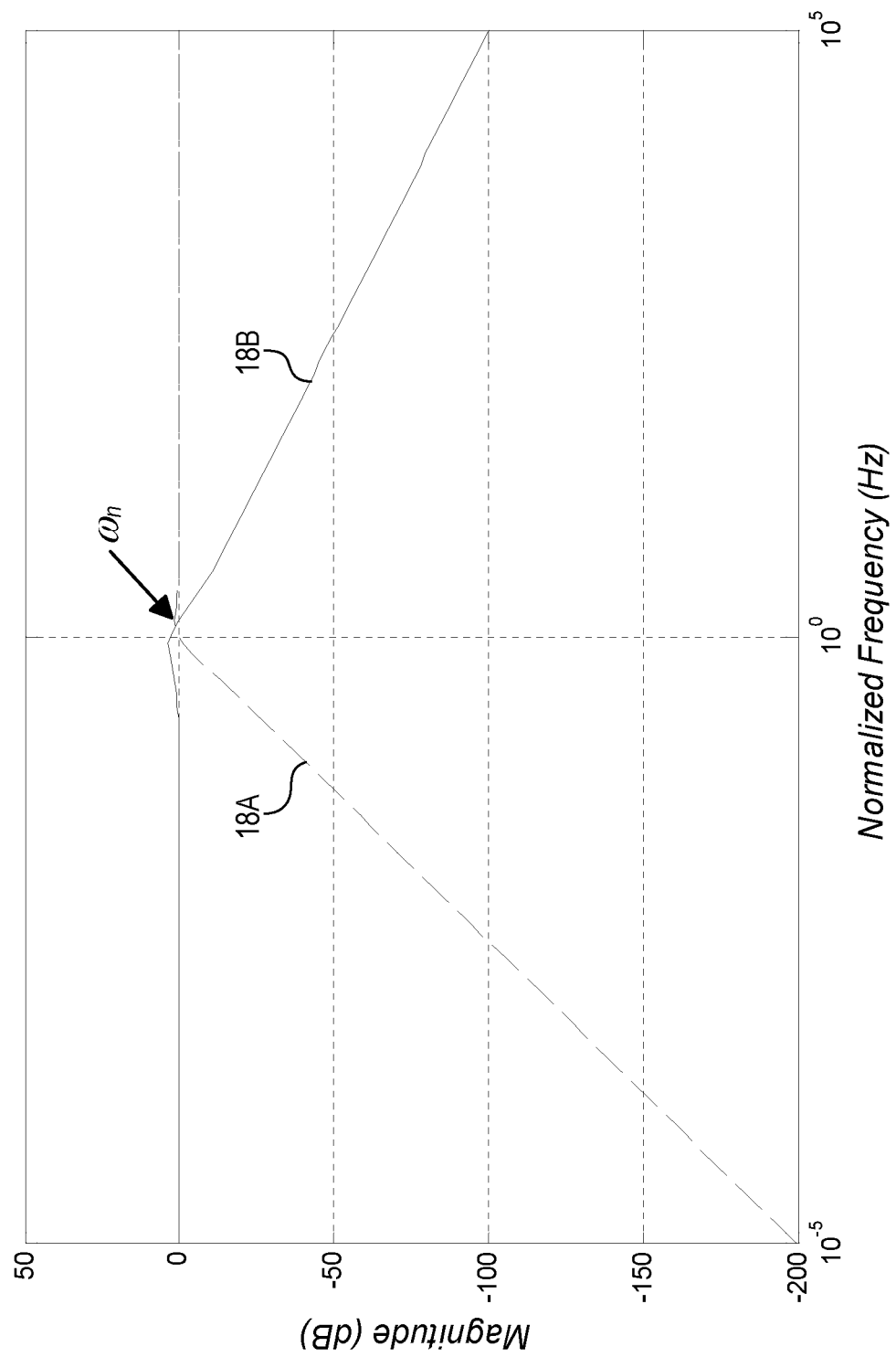
FIG. 1C is a graph showing the magnitude responses of the noise-transfer-function and the signal-transfer-function of a conventional noise-shaping modulator.
Figure 2:
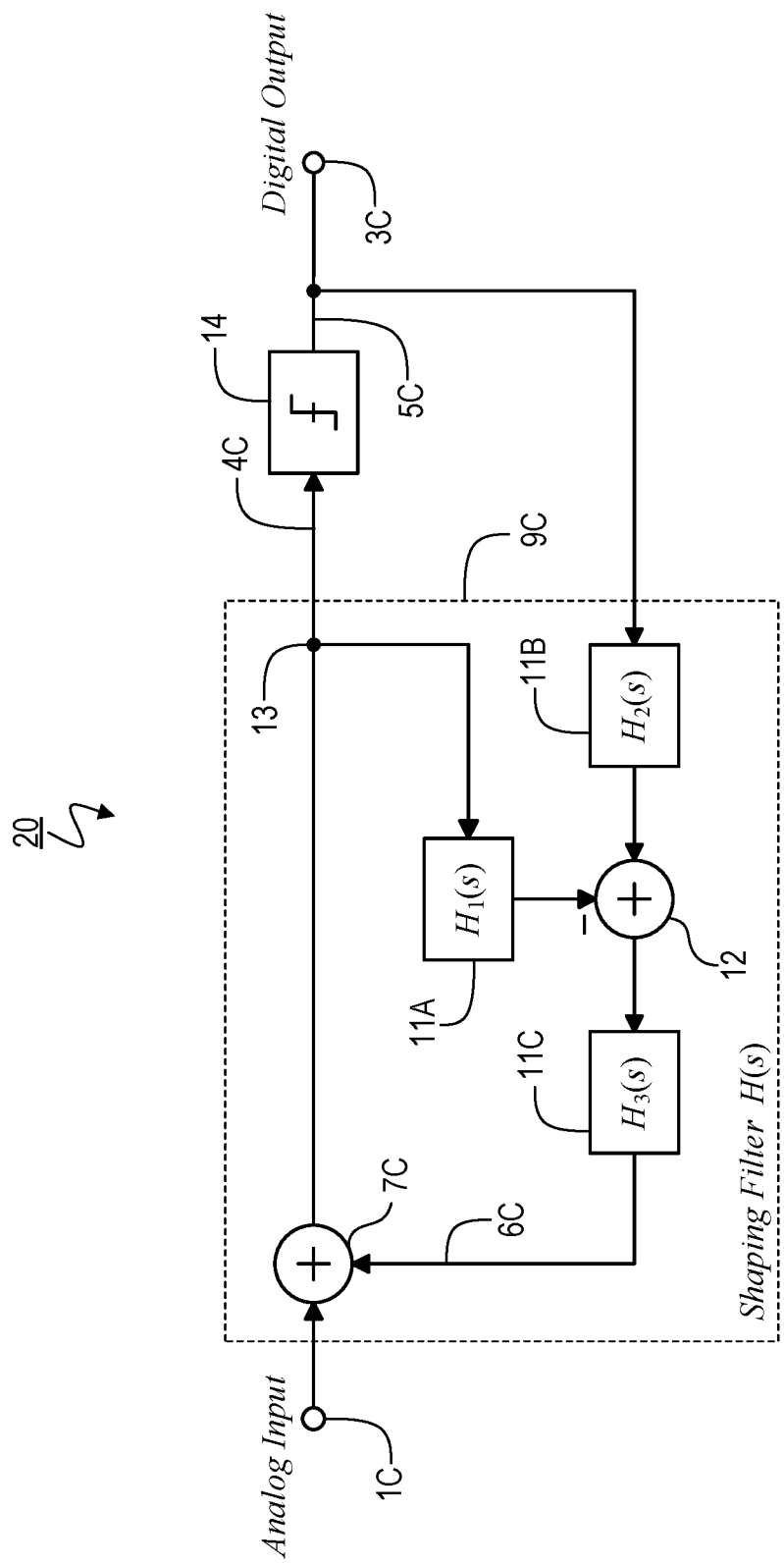
FIG. 2 is a block diagram of a conventional diplexing-feedback-loop (DFL) modulator that shapes quantization noise according to a second-order response, utilizing feedback filters in a diplexing arrangement.

In the preferred embodiments, an explicit reference signal (e.g., as described above) is injected onto the input of a quantizing element (or alternatively, at an interior point within a quantizing element) via a combining operation, so that it will be subjected to the noise-shaped response of the modulator. For the case of a properly tuned modulator, therefore, the amplitude of the reference signal will be minimized at the output of the quantizing element, when the reference signal (calibration waveform) includes a narrowband frequency component which is equal to the center of the intended stopband response of the noise-transfer-function produced by the modulator (i.e., for the case where the actual center of the stopband response is precisely equal to the intended center of the stopband response). More specifically, when exemplary calibration circuit 100A is used in conjunction with a diplexing-feedback-loop modulator (e.g., DFL modulator 20 shown in FIG. 2), and the output of combiner 112 is coupled to output line 105A via the quantizing element of the modulator (e.g., coupled via quantizing element 14 of converter 20), then the reference signal is subjected to a linearized noise-transfer-function (NTF) given by $$NTF(s) = \frac{1 + H_1(s) \cdot H_3(s)}{1 + H_1(s) \cdot H_3(s) - H_2(s) \cdot H_3(s)}$$
$$= \frac{\varphi_{00} \cdot W_{00}(s) + \varphi_{01} \cdot W_{01}(s)}{1 + \varphi_{00} \cdot W_{00}(s) + \varphi_{01} \cdot W_{01}(s) - \varphi_{10} \cdot W_{10}(s) + \varphi_{11} \cdot W_{11}(s)}.$$

which for $W_{ij}(s)$ being lowpass responses of first to fifth order, exhibits a band-stop response with characteristics determined by gain parameters $\phi_{ij}$. In the preferred embodiments, the reference signal is provided to the input of a quantizing element at a level which, for a properly tuned noise-transfer-function, produces a negligible impact on the normal operation of the associated data converter (i.e., the quality with which analog signals are converted into representative digital samples is negligibly degraded).

Figure 5:
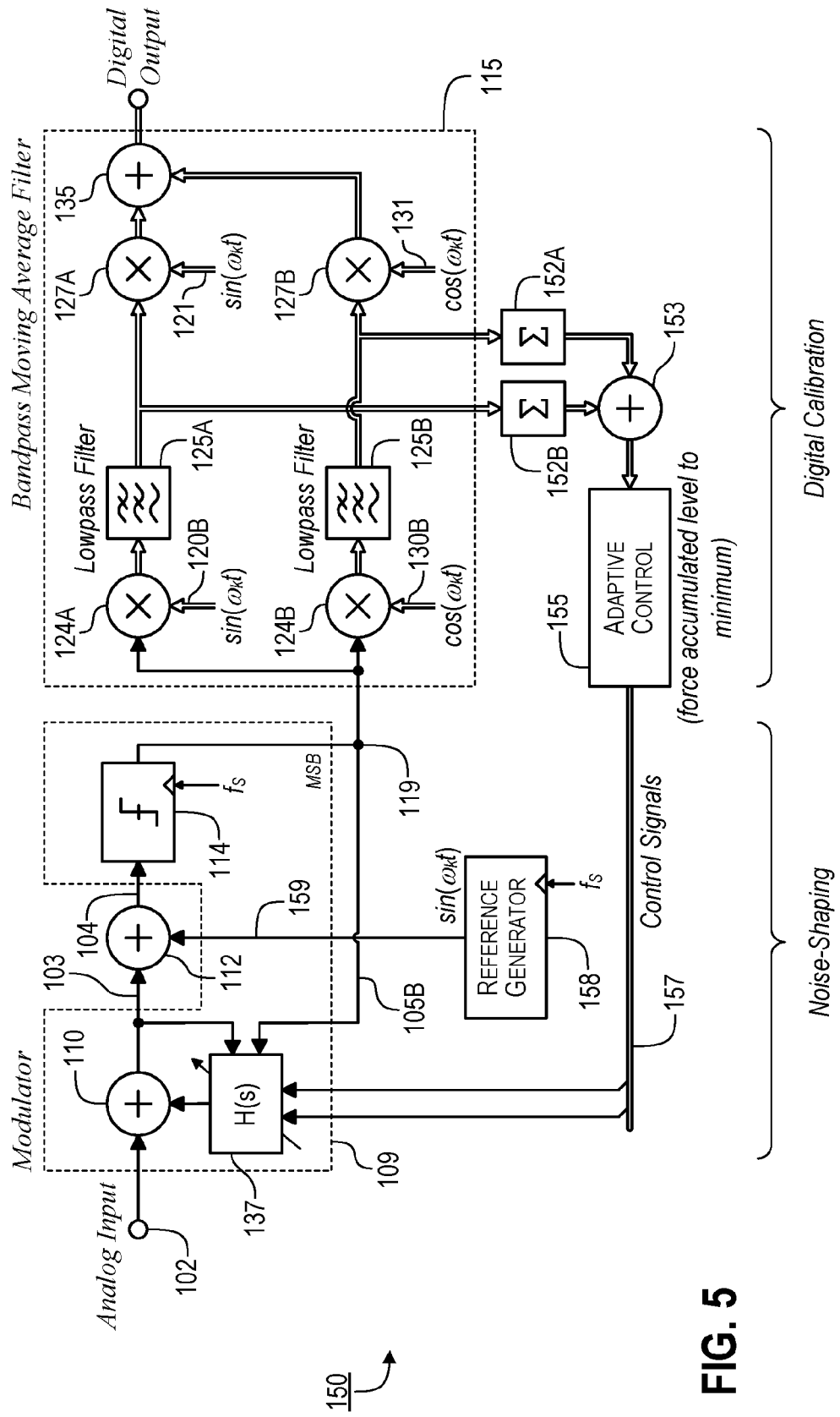
FIG. 5 illustrates a data converter which incorporates a diplexing-feedback-loop (DFL) modulator and actively calibrates the response of a noise-transfer-function according to a representative embodiment of the invention, using the mean value at the output of a quadrature detector to minimize the level of an injected reference signal.

DFL-based data converter 150, shown in FIG. 5, illustrates use of a diplexing-feedback-loop (DFL) modulator with active calibration, according to the preferred embodiments of the invention. The present invention can be similarly used in conjunction with other conventional noise-shaping modulators, including conventional continuous-time and discrete-time delta-sigma ($\Delta\Sigma$) modulators, and such alternate uses should be considered within the scope of the invention. Referring to DPL-based data converter 150, the input on line 103 of the calibration circuit (and, more specifically in the current embodiment, the input to combiner 112 which, as noted above, is part of injection block circuitry 106 in FIG. 4A) receives a continuous-time signal that is provided as an output by noise-shaping modulator 109 (i.e., the input of the calibration circuit is coupled to a modulator output). The output of combiner 112, on line 104 of the calibration circuit, is provided as an input to the modulator and, more specifically in the current embodiment, the output of combiner 112 is provided as an input to quantizing element 114 within modulator 109. Output line 105B of the calibration circuit (e.g., corresponding to output line 105A which, as noted above, is part of injection block circuitry 106 in FIG. 4A) connects to the output of quantizing element 114 at node 119, and is fed back to shaping filter 137 of modulator 109. The output signal at node 119 also is provided as an input to the detection block circuitry of the calibration circuit (e.g., detection block circuitry 107 in FIG. 4A). According to the exemplary embodiment of data converter 150, therefore, quantizing element 114 couples output 104 of the injection block circuitry to both the output of the injection block circuitry on line 105B (i.e., as a signal which preferably is fed back to the input of a noise-shaping modulator), and to the input of the detection block circuitry at node 119. Additionally, combiner 112 is used to inject reference signal (calibration waveform) 159, which is an output from reference generator 158, into quantizing element 114 before node 119. In the preferred embodiments, reference signal 159 contains a narrowband component at frequency $\omega_k$, which corresponds to the center of the intended stopband response of the noise-transfer function produced by modulator 109.

DFL-based data converter 150 utilizes a bandpass moving-average filter (e.g., reconstruction filter) 115, which includes quadrature downconversion (e.g., mixers 124A&B) and lowpass filtering (e.g., filter 125A&B). Therefore, the detection block circuitry of the calibration circuit within data converter 150 preferably does not provide for a dedicated (separate) quadrature downconversion operation (e.g., does not provide the dedicated quadrature downconversion operation provided by mixers 123A&B in circuit 100A). Instead, summation operations 152A&B of the detection block circuitry within data converter 150, preferably are coupled to the output of the calibration circuit at node 119, via the quadrature downconverter within bandpass moving-average filter 115. In embodiments where the bandpass filter function does not include downconversion, however, the preferred detection block circuitry includes downconversion as a dedicated function. The output of adder 153 is minimized when the noise-transfer-function of the DFL modulator (e.g., modulator 109) is properly aligned with the passband of the reconstruction filter. In the preferred embodiments, therefore, output signals 157 from adaptive control unit 155 are continually altered in an attempt to minimize a signal provided at its input (e.g., the output of adder 153 in the current embodiment). More specifically, in the current embodiment output control signals 157 are used as, or are used to adjust (e.g., alternately) the coefficients of DFL shaping filter 137 (i.e., gain parameters $\phi_{ij}$ in the current embodiment). In various different embodiments, changes in outputs 157 of adaptive control module 155, ultimately result in changes to its inputs, and module 155 preferably attempts to alter such outputs 157 in a way that will result in minimization of those inputs, e.g., using a conventional algorithm that employs joint optimization, decision-directed feedback, gradient descent, and/or least squared-error (LSE) principles.

Figure 6:
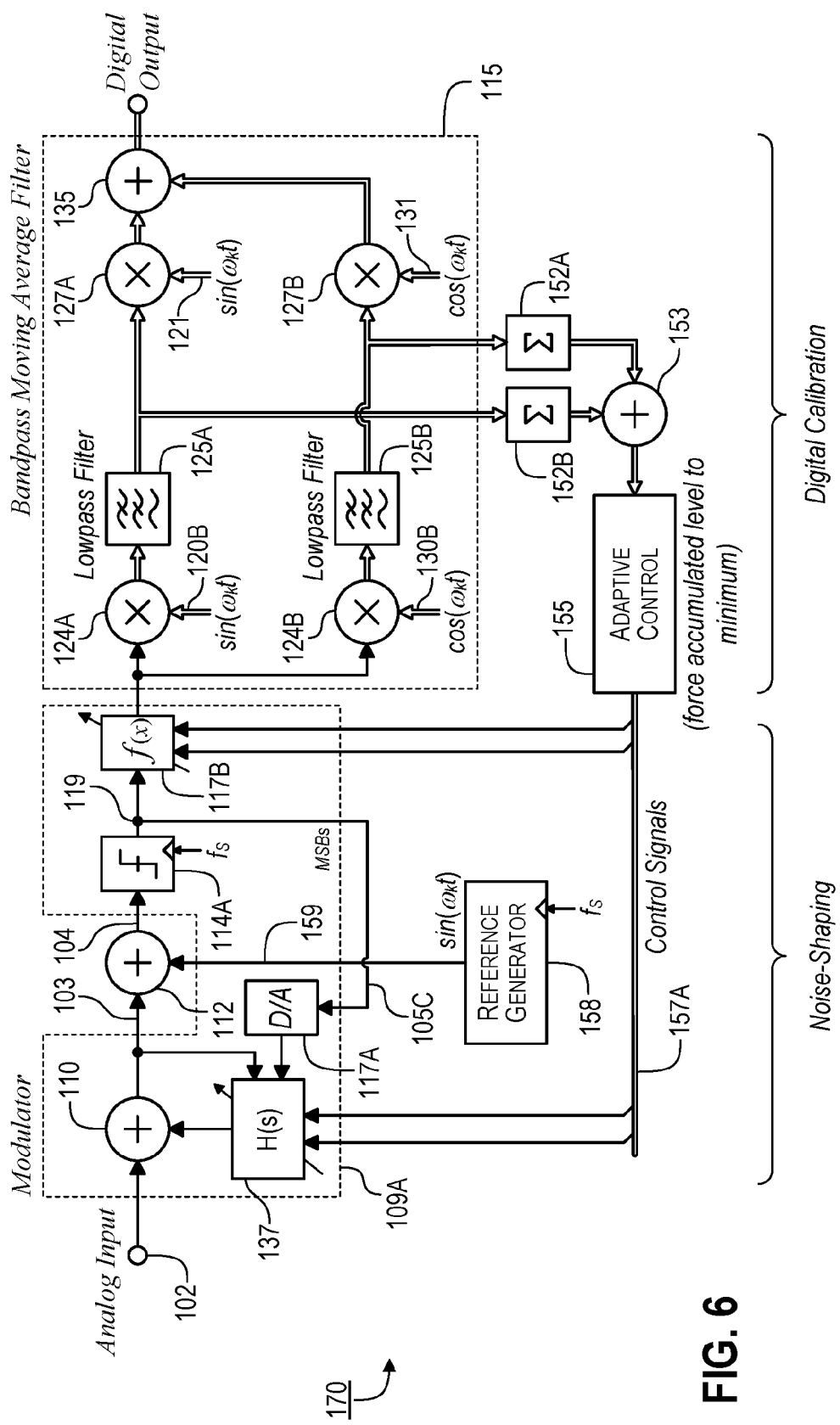
FIG. 6 illustrates a data converter which incorporates a diplexing-feedback-loop (DFL) modulator and actively calibrates a nonlinear bit-mapping function according to a representative embodiment of the invention, using the mean value at the output of a quadrature detector to minimize the level of an injected reference signal.

Data converter 170, shown in FIG. 6, illustrates use of a diplexing-feedback-loop (DFL) modulator with an alternative active calibration, according to the preferred embodiments of the invention. The processing in DFL-based data converter 170 is similar to that of data converter 150, except that for the calibration circuit of data converter 170: 1) the output signal from the injection block circuitry is fed back to DFL shaping filter 137 via a digital-to-analog converter (e.g., the signal on output line 105C is coupled to shaping filter 137 by D/A converter 117A in the current embodiment); and 2) the output signal from the injection block circuitry is coupled to the input of the detection block circuitry via a nonlinear bit-mapping function (e.g., the output signal at line 105C and node 119 is coupled to downconverting mixers 124A&B via circuit 117B in the current embodiment). In the exemplary embodiment of data converter 170, quantizing element 114A has a multi-bit output (e.g., an output which employs binary encoding or unary encoding), from which D/A converter 117A produces a multi-level signal. Imperfect scaling within D/A converter 117A, however, can introduce nonlinear distortion that causes the continuous-time signal, which is fed back into DFL shaping filter 137, to differ from the discrete-time representation of that signal at the output of quantizing element 114A. Without calibration, this imperfect scaling, and the resulting distortion, degrades the accuracy of the DFL noise-shaped response. In exemplary data converter 170, the imperfect scaling associated with D/A converter 117A is corrected by applying a nonlinear bit-mapping function (e.g., an imperfect scaling within circuit 117B) to the output of quantizing element 114A, before that output (i.e., the signal at node 119) is coupled to the input of the detection block circuitry of the calibration circuit. In the preferred embodiments of data converter 170, the nonlinear bit-mapping function of circuit 117B: 1) produces a multi-bit output with imperfect scaling by applying a nonuniform weighting factor to each bit of multi-bit input; and 2) is implemented using any of various conventional means including lookup tables, digital encoders, multiplier arrays, etc. The aforementioned alternate implementations should be considered within the scope of the present invention. Using the active calibration method of the preferred embodiments, the nonuniform weighting factors associated with nonlinear bit-mapping circuit 117B, are adjusted to accurately reproduce the scaling imperfections (i.e., nonlinearities) of D/A converter 117A.

When the scaling imperfections of the nonlinear bit-mapping function and the D/A converter are precisely aligned, the (imprecise) discrete-time version of the signal at the input to reconstruction filter 115 (e.g., the input to downconverting mixers 124A&B of the detection block circuitry in the current embodiment) is closely matched to the (imprecise) continuous-time version of the signal that is fed back into DFL shaping filter 137 (e.g., the continuous-time signal that is coupled from output line 105C of the injection block circuitry). Consequently, the nonlinear distortion introduced by D/A converter 117A is subjected to the noise-shaped response of modulator 109A. This can be shown by noting that in the absence of quantization noise and input signal, the output ($y_1$) of quantizing element 114A is given by $$y_1 = \varepsilon_D \cdot \frac{H_2(s) \cdot H_3(s)}{1 + H_3(s) \cdot (G \cdot H_1(s) - H_2(s))},$$

and the output ($y_2$) of nonlinear bit-mapping function 117B is given by $$y_2 = y_1 + \varepsilon_M =$$

$$\varepsilon_D \cdot \frac{H_2(s) \cdot H_3(s)}{1 + H_3(s) \cdot (G \cdot H_1(s) - H_2(s))} + \varepsilon_M \cdot \frac{1 + H_3(s) \cdot (G \cdot H_1(s) - H_2(s))}{1 + H_3(s) \cdot (G \cdot H_1(s) - H_2(s))},$$

where $\epsilon_D$ is nonlinear distortion introduced by D/A converter 117A and $\epsilon_M$ is nonlinear distortion introduced by nonlinear bit-mapping function 117B. Therefore, when the nonlinear distortion introduced by D/A converter 117A is equal to the nonlinear distortion introduced by the nonlinear bit-mapping function 117B, such that $\epsilon_D = \epsilon_M = \epsilon$, then the overall distortion-transfer-function (DTF=$y_2/\epsilon$) is given by $$DTF(s) = \frac{1 + G \cdot H_1(s) \cdot H_3(s)}{1 + H_3(s) \cdot (G \cdot H_1(s) - H_2(s))} = NTF(s).$$

Since the resulting distortion-transfer-function (DTF) is equal to the noise-transfer-function (NTF), the distortion of D/A converter 117A is subjected to the noise-shaped response of modulator 109A when $\epsilon_D = \epsilon_M$. In the preferred embodiments of exemplary data converter 170, the response of nonlinear bit-mapping circuit 117B is continuously altered via control signals 157A in an attempt to minimize the level of the signal at the input to adaptive control unit 155 (e.g., the output of adder 153 in the current embodiment). In similar fashion to the processing described in detail for the embodiment of data converter 150, the amplitude of the reference signal (e.g., signal 159) that is coupled to the input of control unit 155, is minimized when the scaling imperfections of the nonlinear bit-mapping function are properly aligned with the scaling imperfections of the D/A converter. Although active calibration is employed in the preferred embodiments to indirectly correct for the scaling imperfections of the D/A converter (e.g., D/A converter 117A) by adjusting a nonlinear bit-mapping function (e.g., within circuit 117B), in alternative embodiments the active calibration method is used to directly adjust the imperfect scaling occurring within the D/A converter itself. Such alternative embodiments should be considered within the scope of the present invention.

ADDITIONAL CONSIDERATIONS

As used herein, the term "coupled", or any other form of the word, is intended to mean either directly connected or connected through one or more other elements, such as via a sampling/quantization circuit or via other processing blocks.

In the preceding discussion, the terms "operators", "operations", "functions" and similar terms can refer to method steps or hardware components, depending upon the particular implementation/embodiment.

In the event of any conflict or inconsistency between the disclosure explicitly set forth herein or in the attached drawings, on the one hand, and any materials incorporated by reference herein, on the other, the present disclosure shall take precedence. In the event of any conflict or inconsistency between the disclosures of any applications or patents incorporated by reference herein, the disclosure having the most recent priority date shall take precedence.

Unless clearly indicated to the contrary, words such as "optimal", "optimize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing constraints.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

In the discussions above, the words "include", "includes", "including", and all other forms of the word should not be understood as limiting, but rather any specific items following such words should be understood as being merely exemplary.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for calibrating a noise-shaping modulator, said apparatus comprising:
an input line for receiving an input signal;
a combiner having a first input coupled to the input line, a second input coupled to a reference signal and an output coupled to a first output line;
a frequency downconverter having an input coupled to said first output line and also having a baseband output;
a summation circuit having an input coupled to the baseband output of said frequency downconverter and also having an output; and
an adaptive control unit having an input coupled to the output of said summation circuit and an output coupled to a second output line,
wherein the output of said summation circuit is proportional to a representative signal level at the baseband output of said frequency downconverter, and wherein the output of said adaptive control unit is continually altered in an attempt to minimize a signal provided at the input of said adaptive control unit.

2. An apparatus according to claim 1, wherein said combiner is coupled to said first output line via a sampling/quantization component.

3. An apparatus according to claim 1, wherein said frequency downconverter uses sine and cosine sequences to produce quadrature and in-phase outputs at baseband, and each of said quadrature and in-phase outputs at baseband is coupled to said summation circuit.

4. An apparatus according to claim 1, wherein said reference signal is a periodic binary pulse at a constant frequency, and wherein a frequency of a sinusoidal sequence used by said frequency downconverter is an integer multiple of said constant frequency.

5. An apparatus according to claim 1, wherein said reference signal is a square wave at a constant frequency, and wherein a frequency of a sinusoidal sequence used by said frequency downconverter is an odd integer multiple of said constant frequency.

6. An apparatus according to claim 1, wherein the function of said frequency downconverter is performed by a bandpass filter that employs bandpass moving-average filtering.

7. An apparatus according to claim 1, wherein the output of said adaptive control unit is generated by said adaptive control unit using at least one of joint optimization, decision-directed feedback, gradient descent, or least squared-error (LSE) principles.

8. An apparatus according to claim 1, wherein said reference signal includes a narrowband frequency component which corresponds to a frequency of a sinusoidal sequence used by said frequency downconverter.

9. An apparatus according to claim 1, wherein said frequency downconverter uses at least one of a sine or a cosine sequence to generate said baseband output, and the frequency of said sine or cosine sequence corresponds to a center of an intended noise-transfer-function stopband response.

10. An apparatus according to claim 1, further comprising a sampling/quantization device having an input coupled to the output of the combiner and an output coupled to the input of the frequency downconverter.

11. An apparatus according to claim 1, further comprising a noise-shaping filter having an output coupled to the input line.

* * * * *

UNITED STATES PATENT AND TRADEMARK OFFICE
CERTIFICATE OF CORRECTION

PATENT NO. : 9,838,030 B1
APPLICATION NO. : 15/478395
DATED : December 5, 2017
INVENTOR(S) : Christopher Pagnanelli It is certified that error appears in the above-identified patent and that said Letters Patent is hereby corrected as shown below:

On the Title Page

Item (54) Title, change "APPARATUSES AND METHODS FOR SAMPLE-RATE CONVERSION" to --METHODS AND APPARATUSES FOR CALIBRATING A NOISE-SHAPING MODULATOR--.

In the Specification

Column 1 Lines 1 and 2, Title, change "APPARATUSES AND METHODS FOR SAMPLE-RATE CONVERSION" to --METHODS AND APPARATUSES FOR CALIBRATING A NOISE-SHAPING MODULATOR--.

Column 6 Line 12, change "narrowb and" to --narrowband--.

Signed and Sealed this
Twenty-fifth Day of September, 2018

Andrei Iancu
*Director of the United States Patent and Trademark Office*